(12) United States Patent
Srinivasan et al.

(10) Patent No.: US 10,488,732 B2
(45) Date of Patent: Nov. 26, 2019

(54) MULTIMODE INTERFERENCE BASED VPIN DIODE WAVEGUIDES

(71) Applicants: IMEC VZW, Leuven (BE); Universiteit Gent, Ghent (BE)

(72) Inventors: Ashwyn Srinivasan, Heverlee (BE); Joris Van Campenhout, Brussels (BE)

(73) Assignees: IMEC VZW, Leuven (BE); UNIVERSITEIT GENT, Ghent (BE)

( * ) Notice: Subject to any disclaimer, the term of this patent is extended or adjusted under 35 U.S.C. 154(b) by 0 days.

(21) Appl. No.: 16/223,757

(22) Filed: Dec. 18, 2018

(65) Prior Publication Data
US 2019/0196296 A1    Jun. 27, 2019

(30) Foreign Application Priority Data

Dec. 22, 2017    (EP) .................................... 17210498

(51) Int. Cl.
*G02F 1/225*       (2006.01)
*H01S 5/50*        (2006.01)
(Continued)

(52) U.S. Cl.
CPC ........ *G02F 1/2257* (2013.01); *G02F 1/01708* (2013.01); *H01L 31/028* (2013.01);
(Continued)

(58) Field of Classification Search
CPC ............... G02F 1/2257; G02F 1/01708; G02F 2202/105; G02F 2001/0157;
(Continued)

(56) References Cited

U.S. PATENT DOCUMENTS 4,416,013 A * 11/1983 Tobin .................... H01S 3/0635
372/18
6,310,700 B1 * 10/2001 Betts ..................... B82Y 10/00
359/2
(Continued)

FOREIGN PATENT DOCUMENTS

EP          0853397 A2    7/1998
EP          0853397 A3    6/2000
(Continued)

OTHER PUBLICATIONS

European Search Report, European Patent Application No. 17210498.6, dated Jun. 5, 2018, 8 pages.
(Continued)

*Primary Examiner* — Ryan A Lepisto
(74) *Attorney, Agent, or Firm* — McDonnell Boehnen Hulbert & Berghoff LLP (57) ABSTRACT

Example embodiments relate to an electro-optical device that includes a vertical p-i-n diode waveguide. The electro-optical device includes a waveguide portion adapted for propagating a multimode wave, the waveguide portion including an intrinsic semiconductor region of the vertical p-i-n diode, a first contact and a second contact for electrically contacting a first electrode and a second electrode of the vertical p-i-n diode. The device also includes an input section for coupling radiation into the waveguide portion and an output section for coupling radiation out of the waveguide portion. The input section, the output section, and the waveguide portion are configured to support a multimode interference pattern for the multimode wave with an optical field with a lateral inhomogeneous spatial distribution in the waveguide portion including regions with higher optical field intensity and regions with lower optical (Continued)

field intensity. The second contact physically contacts the second electrode.

20 Claims, 9 Drawing Sheets

(51) Int. Cl.
G02F 1/017 (2006.01)
H01L 31/105 (2006.01)
H01L 31/028 (2006.01)
G02F 1/015 (2006.01)
G02F 1/21 (2006.01)

(52) U.S. Cl.
CPC ............ H01L 31/105 (2013.01); H01S 5/50 (2013.01); G02F 2001/0157 (2013.01); G02F 2001/217 (2013.01); G02F 2202/105 (2013.01); G02F 2202/108 (2013.01); G02F 2203/48 (2013.01)

(58) Field of Classification Search
CPC .......... G02F 2202/108; G02F 2203/48; G02F 2001/217; H01S 5/50; H01L 31/105; H01L 31/028
See application file for complete search history.

(56) References Cited

U.S. PATENT DOCUMENTS

| | | | |
|---|---|---|---|
| 7,251,408 B1 * | 7/2007 | Gunn, III | G02F 1/025 385/132 |
| 7,555,173 B2 * | 6/2009 | Barrios | G02F 1/025 385/14 |
| 8,786,941 B2 * | 7/2014 | Kuramoto | H01S 5/1064 359/344 |
| 9,134,553 B2 * | 9/2015 | Lim | G02F 1/025 |
| 9,229,251 B2 * | 1/2016 | Akiyama | G02F 1/025 |
| 9,341,921 B2 * | 5/2016 | Xu | G02F 1/015 |
| 9,494,734 B1 * | 11/2016 | Jain | G02F 1/01708 |
| 9,709,830 B2 * | 7/2017 | Akiyama | G02F 1/025 |
| 2001/0014109 A1 | 8/2001 | Hamamoto | |
| 2018/0183212 A1 * | 6/2018 | Van Campenhout | H01S 5/021 |

FOREIGN PATENT DOCUMENTS

GB 2385145 A 8/2003
JP 2009-206463 A 9/2009

OTHER PUBLICATIONS

Feng, Ning-Ning et al., "Vertical p-i-n Germanium Photodetector With High External Responsivity Integrated With Large Core Si Waveguides", Optics Express, vol. 18, No. 1, Jan. 4, 2010, pp. 96-101.

* cited by examiner

MULTIMODE INTERFERENCE BASED VPIN DIODE WAVEGUIDES

CROSS-REFERENCE TO RELATED APPLICATIONS

The present application is a non-provisional patent application claiming priority to European Patent Application No. EP 17210498.6, filed Dec. 22, 2017, the contents of which are hereby incorporated by reference.

FIELD OF THE DISCLOSURE

This disclosure relates generally to the field of vertical p-i-n (VPIN) diode waveguides, and more specifically to an electro-optic device comprising multimode interface-based VPIN diode waveguides.

BACKGROUND

For various applications, it is beneficial to not merely guide light through a waveguide, but to also interact with the guided light, thereby achieving e.g. optical detection, modulation and/or attenuation. In such applications, electro-optic devices are used. Examples of such electro-optic devices are photodetectors, modulators, lasers, and variable optical attenuators. A known way to accomplish modulation is, for example, through the Franz-Keldysh effect or the quantum-confined Stark effect.

Figure 1:
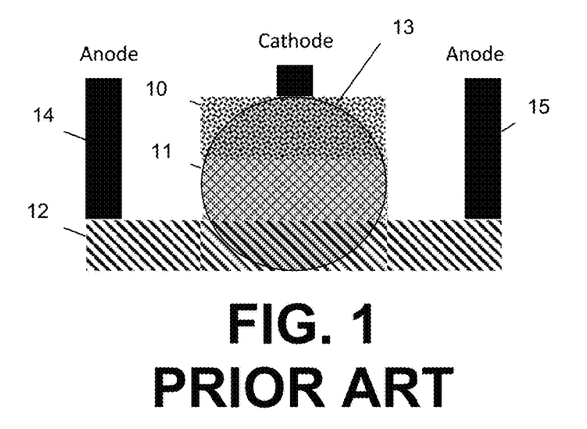
FIG. 1 illustrates a cross-sectional view of a VPIN diode, according to example embodiments.

Basic components used in electro-optic devices for inducing an electric field are diodes, built around a portion of the waveguide. Two types of p-i-n diode waveguides that can be used are lateral p-i-n (LPIN) and vertical p-i-n (VPIN) diode rib waveguides. In a LPIN rib waveguide, the p-i-n diode is arranged in a lateral configuration, whereas in a VPIN diode rib waveguide, the p-i-n diode is arranged as a vertically stacked combination of p-type, intrinsic and n-type layers. VPIN diode waveguides are able to provide higher electric fields overlapping with a larger area of the guided light, especially for waveguides that have smaller waveguide thickness than waveguide width. An example of a cross-sectional view of a VPIN diode rib waveguide is shown in FIG. 1, whereby a p-type layer 10, an intrinsic layer 11, and an n-type layer 12 is configured in an optical stack, forming the waveguide wherein the optical mode 13 is propagating. Furthermore, contacting elements 14 and 15, according to some conventional examples, are shown to form the cathode and the anode.

Some VPIN diode waveguides may suffer from high metal induced absorption. Metallic contacts in the vicinity of the waveguide may, for example, overlap with and absorb an evanescent portion of the guided light. This absorption, particularly when they occur over an extended length, lead to significant undesired losses in the intensity of the guided light. Ways to alleviate this problem exist, but, to date, remain unsatisfactory. One example of a way to avoid absorption in VPIN diode waveguides is by providing contacts away from the PIN stack region, but this typically requires deposition of additional layers resulting in more processing complexity, and larger diode contact resistance. Another example is the use of designs in the VPIN diode waveguide whereby a whispering gallery mode is used for pushing away the light from the metal contact. Nevertheless, for high refractive index materials, long linear waveguide devices such as electro-absorption modulators and photodetectors cannot be realized with this approach.

Thus, there is still a need in the art for VPIN diodes comprising a waveguide portion that address some or all of the above-mentioned issues.

SUMMARY

Various embodiments may provide vertical p-i-n (VPIN) diode waveguides with low optical loss due to electrical contacts by exploiting multimode interference (MMI).

In some embodiments, a multi-mode interferometer effect is used for spatial engineering of the optical field path in the VPIN diode waveguide, allowing for positioning of the top metal contacts at low intensity regions, thus reducing or even avoiding absorption effects.

In some embodiments, the waveguide can be scaled to any appropriate length by realizing the proper in- and out-coupling sections.

In some embodiments, VPIN diode waveguides are obtained with low RC delay for high-speed operation.

In a first aspect, the present disclosure relates to an integrated electro-optical semiconductor device comprising a vertical p-i-n diode, the device comprising a waveguide portion adapted for propagating a multimode wave comprising an intrinsic semiconductor region of the vertical p-i-n diode, a first contact and a second contact for electrically contacting a first electrode and a second electrode of the vertical p-i-n diode, an input section for coupling radiation into the waveguide portion, an output section for coupling radiation out of the waveguide portion, the input section, the output section and the waveguide portion of the vertical p-i-n diode being configured for supporting a multimode interference pattern for the multimode wave with an optical field with a lateral inhomogeneous spatial distribution in the waveguide portion comprising regions with higher optical field intensity and regions with lower optical field intensity, the second contact physically contacting the second electrode in at least one region of the waveguide with lower optical field intensity.

In some embodiments, contacts (e.g., metal contacts) can be positioned in a region of low radiation intensity to limit optical absorption (e.g. high metal induced optical absorption). It is a further advantage of embodiments of the present disclosure that additional processing steps required in conventional VPIN diodes for limiting optical absorption can be avoided.

In some embodiments, devices with high efficiency can be obtained due to the position of the contacts and doped layers, which allows a high electric field intensity.

In some embodiments, devices with high optical confinement can be obtained by using a thin waveguide portion.

In some embodiments, devices can be obtained combining both high optical confinement and high electric field confinement.

In some embodiments, the optical loss occurring in the vertical p-i-n diode due to the electrical contact(s) can be small.

In some embodiments, low-resistance ohmic contacts can be used on the waveguide.

In some embodiments, at least one of the input section and/or the output section may be configured with respect to the interface with the waveguide portion so as to excite at least two guided modes of the multimode waveguide portion.

In some embodiments, the input section and/or the output section may have, at the interface with the waveguide portion, a smaller width than the width of the waveguide portion.

In some embodiments, the width of the input section or output section is equal to or less than half the width of the waveguide portion, which allows excitation of different modes of the multimode waveguide portion.

In some embodiments, at the interface between the waveguide portion on the one hand and the input section and/or the output section on the other hand, the center of the input section and/or the output section may be substantially aligned with a local maximum intensity of the interference pattern of the at least two guided modes of the multimode waveguide portion.

In some embodiments, the device may be adapted for inducing the interference pattern such that the higher optical field intensity follows a meandering path along the propagation direction in the waveguide portion.

In some embodiments, the device may be configured for exciting in the multimode waveguide portion an odd first order mode and an even first order mode.

In some embodiments, the first contact may be formed at least partly below the regions of higher optical field intensity along the propagation direction in the waveguide portion.

In some embodiments, the vertical PIN diode has a shape along the propagation direction in the waveguide portion following the regions of higher optical field intensity.

In some embodiments, the meandering path and the positioning of contacts on the waveguide edges with respect to the meandering path result in a tighter geometry, so a compact device can be obtained.

In some embodiments, the first electrode may be a doped layer forming a p-layer or an n-layer of the vertical p-i-n diode, having a pattern following the regions of higher optical field intensity.

In some embodiments, a resistance in the electro-optical device can be relatively low. In some embodiments of the present disclosure, a capacitance in the electro-optical device may also be relatively low.

In some embodiments, the waveguide portion may be a rib waveguide.

In some embodiments, devices can be provided wherein a particular doping of the underlying waveguide along the propagation path of the optical mode can be implemented resulting in low-capacitance diodes.

In some embodiments, the electro-optical device may be a semiconductor device.

In some embodiments, the vertical p-i-n diode may be implemented in one of a Ge on Si material system, a Si material system, a Ge material system, a GeSi material system, a GeSn material system, a SiGeSn material system or a III-V based material system.

In some embodiments, the length of the waveguide of the VPIN diode waveguide can be scaled to substantially any desired length, taking into account the multimode waveguide pattern.

In some embodiments, the optical field with a lateral inhomogeneous spatial distribution may be adapted so that at least 50% of a surface area of the waveguide portion has the lower optical field intensity and is usable as contact area for the second contact.

In some embodiments, the vertical p-i-n diode may be reverse biased.

In some embodiments, the electro-optical device may be a Ge based photodetector.

In some embodiments, photodetectors can be provided that are high responsivity and high speed.

In some embodiments, the device may be a Franz-Keldysh effect electro-absorption modulator or the device may be a multi-quantum well based quantum-confined Stark effect based electro-absorption modulator.

In some embodiments, electro-absorption modulators can be obtained that exhibit low insertion loss, a high extinction ratio, and a high speed.

In some embodiments, the device is a variable optical attenuator.

In a second aspect, the present disclosure relates to a method for manufacturing an integrated electro-optical semiconductor device comprising a vertical p-i-n diode, the device comprising a waveguide portion adapted for propagating a multimode wave, the waveguide portion comprising an intrinsic semiconductor region of the vertical p-i-n diode, the method comprising:

providing a first electrode in a pattern on a substrate, the first electrode being doped with charge carriers of a first charge;

providing an intrinsic semiconductor region on the first electrode, providing a second electrode on the intrinsic semiconductor region, the second electrode being doped with charge carriers of an opposite charge;

providing an input section for coupling radiation into the waveguide portion, and an output section for coupling radiation out of the waveguide portion;

forming a first contact for electrically contacting the first electrode of the vertical p-i-n and forming a second contact for electrically contacting the second electrode of the vertical p-i-n diode, wherein the waveguide portion comprises at least part of the intrinsic semiconductor region of the vertical p-i-n diode;

performing optical simulation of the interference pattern along the propagation, for wavelengths which will be used with the device;

determining the positions of low (e.g. minimum) intensity in the lateral spatial distribution via the simulation;

optionally optimizing the geometry of the waveguide, contacts, and input/outputs, and then placing the second contacts in the regions of low intensity, wherein the input section, the output section and the waveguide portion of the vertical p-i-n diode waveguide being configured for supporting a multimode interference pattern for the multimode wave with an optical field with a lateral inhomogeneous spatial distribution in the waveguide portion comprising regions with higher optical field intensity and regions with lower optical field intensity, the second contact physically contacting the second electrode in at least one region of the waveguide with lower optical field intensity.

The present disclosure is set out in the accompanying independent and dependent claims. Features from the dependent claims may be combined with features of the independent claims and with features of other dependent claims as appropriate and not merely as explicitly set out in the claims.

The above and other characteristics and features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

In the different figures, the same reference signs refer to the same or analogous elements, according to an example embodiment.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over, under and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

Where in embodiments of the present disclosure reference is made to a meandering path, reference is made to a non-straight path obtained when the regions of higher optical field intensity are connected to each other, along the propagation direction in the waveguide portion. In some embodiments, the meandering path may have a plurality of curves and may vary a plurality of times in direction.

In a first aspect, the present disclosure relates to an integrated electro-optical semiconductor device comprising a vertical p-i-n diode (VPIN) waveguide, the device comprising a waveguide portion adapted for propagating a multimode wave, the waveguide portion comprising an intrinsic semiconductor region of the vertical p-i-n diode. The device also comprises a first contact and a second contact for electrically contacting a first electrode and a second electrode of the vertical p-i-n diode. The VPIN diode waveguide also comprises an input section for coupling radiation into the waveguide portion and an output section for coupling radiation out of the waveguide portion. The input section, the output section and the waveguide portion of the vertical p-i-n diode according to embodiments of the present disclosure are configured for supporting a multimode interference pattern for the multimode wave with an optical field with a lateral inhomogeneous spatial distribution in the waveguide portion comprising regions with higher optical field intensity and regions with lower optical field intensity, the second contact physically contacting the second electrode in at least one region of the waveguide with lower optical field intensity.

According to some embodiments of the present disclosure that the problem of optical absorption (e.g. high metal induced optical absorption) by the contacts (e.g. metal contacts) can be addressed by positioning the contacts over regions of low radiation intensity by exploiting an interference effect of a multimode wave pattern formed in the waveguide, thereby limiting the optical absorption. This reduces the need for additional processing steps for limiting optical absorption, required in conventional VPIN diodes. Furthermore, this positioning of the contacts allows the use of relatively high electric field intensities, in turn enabling to obtain a high efficiency for the device.

Figure 2:
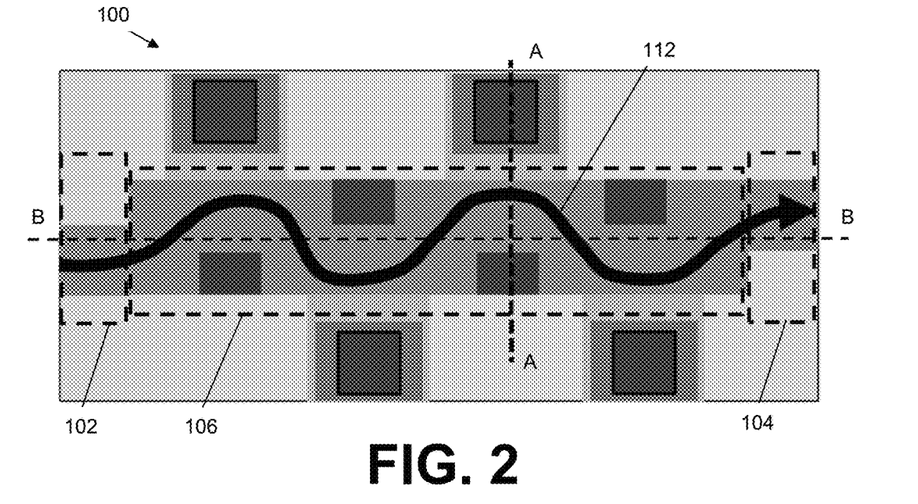
FIG. 2 illustrates a top view of a VPIN diode waveguide, according to example embodiments.
Figure 3:
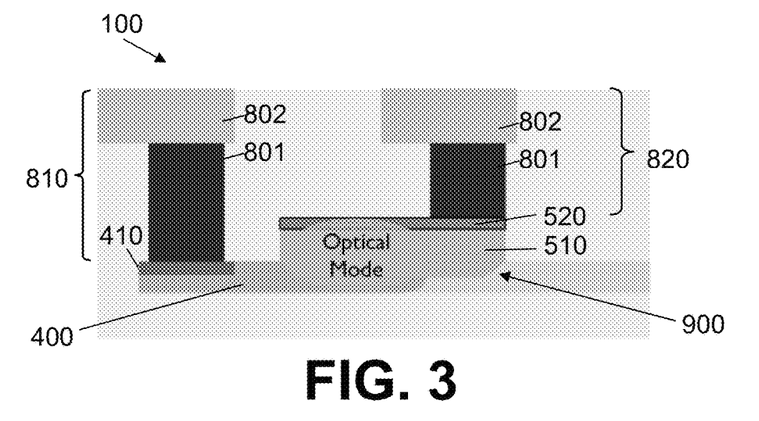
FIG. 3 illustrates a cross-sectional view of a VPIN diode waveguide, according to example embodiments.

By way of illustration, embodiments of the present disclosure not being limited thereto, a number of standard and optional features will now be discussed in more detail, with reference to FIG. 2 and FIG. 3, showing respectively a top view and across-sectional view of a VPIN diode waveguide 100 according to an exemplary embodiment of the present disclosure. In the top view in FIG. 2 and the cross-sectional view in FIG. 3, a VPIN diode waveguide 100 is shown having a waveguide portion 106 adapted for propagating a multimode wave, an input section 102 for coupling radiation into the waveguide portion 106 and an output section 104 for coupling radiation out of the waveguide portion 106. The path 112 of intensity maxima generated by the multimode interference of the multimode of the waveguide portion 106 is shown. In embodiments, the multimode interference intensity maxima pattern 112 may be static and stable in time. The interference pattern 112 typically shows different intensity levels at different lateral positions in the waveguide portion and typically shows different intensity levels along the propagation length of the waveguide portion. By selecting the appropriate modes in the multimode waveguide portion 106, a predetermined pattern 112 according to a predetermined design can then be selected. In embodiments, the device may be adapted for inducing the interference pattern 112 such that the higher optical field intensity follows a meandering path along the propagation direction in the waveguide portion.

In some embodiments, the waveguide portion 106 may be a waveguide portion 106 with a high refractive index contrast with respect to the waveguide cladding material, such as at least 0.5 to 2.5. The refractive index contrast $\Delta$ may, in some embodiments, for example, be defined as $\Delta=(n_1-n_2)$; wherein $n_1$ is the refractive index of the waveguide core and $n_2$ is the refractive index of the waveguide cladding. For example, for a Ge based waveguide, $n_1$ may measure around 4.2 (e.g. for Ge) and $n_2$ may measure around 1.5 (e.g. for $SiO_2$), yielding a refractive index contrast $\Delta$ of about 2.7. In some embodiments, the waveguide portion 106 may have a thickness of 10 nm to 500 nm. Other embodiments may have a thickness of 20 nm to 200 nm. A high optical confinement can be obtained by using a thin waveguide portion 106.

In some embodiments, the waveguide portion 106 may be a rib waveguide. In embodiments, the waveguide portion 106 may have a length of from 50 nm to 100 µm, or even longer. In embodiments, the vertical p-i-n diode waveguide 100 being configured for inducing the multimode interference pattern 112 may comprise selecting the length for the waveguide portion such that the multimode interference pattern 112 can be obtained. The waveguide portion 106 can typically be scaled to an arbitrarily long length, but, within a particular range, only a discrete set of length values may yield the desired multimode interference pattern. As such, the length of the waveguide portion 106 is typically selected in function of this and other particulars of the waveguide portion design (e.g. the location and width of the input and output sections, the width of the waveguide, etc. may be other parameters that are taken into account).

In some embodiments, the length of the waveguide portion 106 of the VPIN diode waveguide 100 can be scaled to substantially any length, provided the input and output section of the multimode waveguide fits the multimode waveguide pattern 112.

In some embodiments, at least one of the input section 102 and/or the output section 104 may be configured with respect to the interface with the waveguide portion 106 so as to excite at least two guided modes of the multimode waveguide portion 106. In embodiments, the input section 102 and/or the output section 104 may have, at the interface with the waveguide portion 106, a width being smaller than the width of the waveguide portion. In embodiments, the width of the input section 102 and/or output section 104 may be equal to or less than half the width of the waveguide portion. Such a width allows excitation of different modes of the multimode waveguide portion 106.

In some embodiments, at the interface between the waveguide portion 106 on the one hand and the input section 102 and/or the output section 104 on the other hand, the center of the input section and/or the output section may be substantially aligned with a local maximum intensity of the interference pattern of the at least two guided modes of the multimode waveguide portion. In some embodiments, the device may be configured for exciting in the multimode waveguide portion an odd first order mode and an even first order mode.

The VPIN diode waveguide 100 comprises a first contact 810 and a second contact 820. In some embodiments, the first contact 810 may be contacting one polarity of the vertical p-i-n diode waveguide 100 while a second contact 820 is contacting the other polarity of the vertical p-i-n diode waveguide 100.

Figure 4:
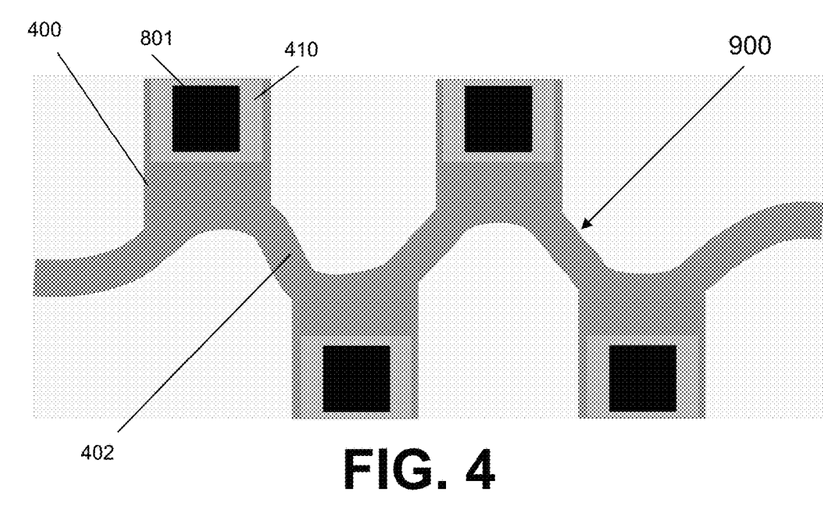
FIG. 4 illustrates the doping profile for the first contact in a VPIN diode waveguide, according to example embodiments.

In some embodiments, the first electrode 400 may be a doped layer forming a p-layer or an n-layer of the vertical p-i-n diode, having a pattern following (e.g. corresponding to) the regions of higher optical field intensity. By way of illustration, FIG. 4, showing a top view of the doping pattern 402 for an exemplary embodiment for a VPIN diode waveguide 100. This doping pattern is designed so as to correspond with the multimode interference pattern of the multimode that will be supported by the waveguide portion 106. In embodiments, the first electrode 400 may be a highly doped layer forming a p+-layer or an n+-layer of the vertical p-i-n diode waveguide 100. A first electrode 400 of which at least a doping profile 402, and the first electrode 400 as a whole, follows the modal distribution in the waveguide portion 106 (e.g. follows the regions of higher optical field intensity) enables the capacitance of the device (e.g. of the diode) to be reduced.

In some embodiments, the optical field with a lateral inhomogeneous spatial distribution may be adapted so that at least 50% of a surface area (e.g. a top surface area) of the waveguide portion 106 is usable as contact area without causing excessive optical absorption loss. Having a large area useable for contacting the waveguide portion reduces the overlay requirement. Additionally, or alternatively, contacting the waveguide portion 106 over a larger area reduces the contact resistance.

In some embodiments, the first contact 810 and/or second contact 820 may be a low-resistance contact, such as an ohmic contact. In some embodiments, the second contact 820 may comprise different contacting locations positioned at an edge of the waveguide portion 106.

In some embodiments, the first contact 810 may be formed by contacting the opposite polarity of the vertical p-i-n diode below the regions of higher optical field intensity along the propagation direction in the waveguide portion.

The first contact 810 and a second contact 820 to contact the first electrode's contact region 410 and the second electrode 520, respectively, are formed by partially filling vias with a contact metal 801 (e.g. W) and subsequently filling the rest of the vias 800 with an interconnect metal 802, e.g. Cu. The second contact 820, and substantially all second contacts 820 in the device, are provided such that they are positioned above regions of the waveguide portion with lower optical field intensity (e.g. the second contacts 820 are anti-aligned with respect to the high-intensity areas of the interference pattern).

The VPIN diode waveguide also comprises an intrinsic portion 510. In some embodiments, the electro-optical device may be a semiconductor device. In embodiments, the vertical p-i-n diode waveguide 100 may be implemented in one of a Ge on Si material system, a Si material system, a Ge material system, a GeSi material system, a GeSn material system, a SiGeSn material system or a III-V based material system.

In some embodiments, the vertical p-i-n diode waveguide 100 may be reverse biased. In embodiments, the electro-optical device may be configured for creating an electric field. In embodiments, the electric field may be created by the vertical p-i-n diode. In some embodiments, the electric field-creating vertical p-i-n diode may be reverse-biased.

The optical mode in the waveguide portion 106 also is shown in FIG. 3.

Figure 5:
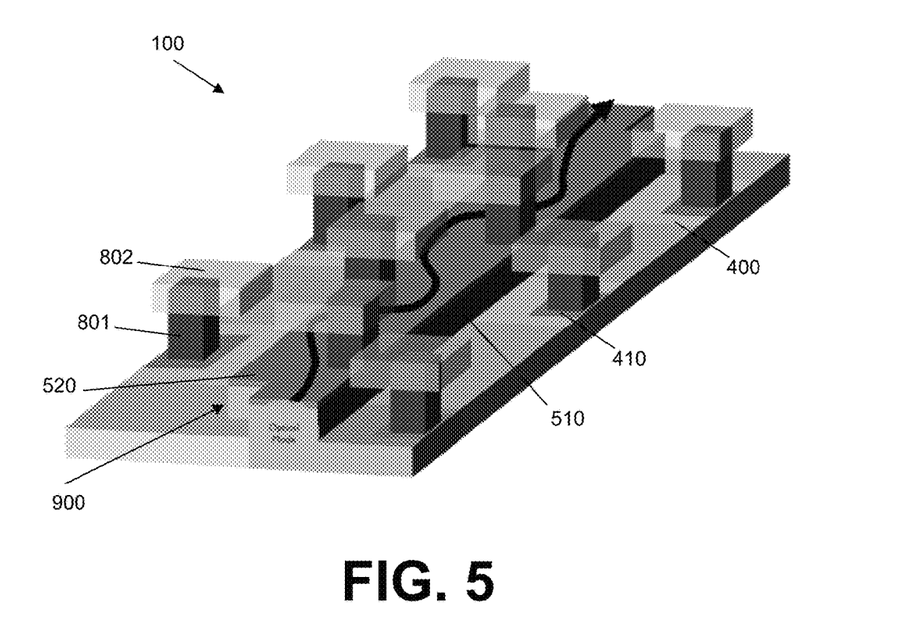
FIG. 5 illustrates a 3D view of an VPIN as shown in FIG. 2 and FIG. 3, according to example embodiments.

By way of illustration, a three dimensional view of the VPIN diode waveguide is illustrated in FIG. 5.

In some embodiments, the electro-optical device may be a photodetector. In some embodiments, the photodetector may be a Ge based photodetector. The electro-optical device can be a photodetector with a high responsivity and speed.

In some embodiments, the device may be an electro-absorption modulator. In embodiments, the electro-absorption modulator may be a Franz-Keldysh effect or multi-quantum well based quantum-confined Stark effect based electro-absorption modulator. In some embodiments, the electro-absorption modulator may be Ge- or GeSi-based, such as a Ge- or GeSi-based Franz-Keldysh effect or multi-quantum well based quantum-confined Stark effect based electro-absorption modulator. The electro-optical device can be an electro-absorption modulator which exhibits a low insertion loss, a high extinction ratio and a high speed.

In some embodiments, the device may be a variable optical attenuator. In some embodiments, the variable optical attenuator may be a Si-, Ge- or GeSi-based optical attenuator.

In some embodiments, any feature of any embodiment of the first aspect may independently be as correspondingly described for any embodiment of the second aspect.

In a second aspect, the present disclosure relates to a method for manufacturing an integrated electro-optical semiconductor device comprising a vertical p-i-n diode waveguide. The device comprises a waveguide portion adapted for propagating a multimode wave, the waveguide portion comprising an intrinsic semiconductor region of the vertical p-i-n diode. The manufacturing method comprises providing a first electrode in a pattern on a substrate, the first electrode being doped with charge carriers of a first charge, providing an intrinsic semiconductor region on the first electrode and providing a second electrode on the intrinsic semiconductor region, the second electrode being doped with charge carriers of an opposite charge. The method also comprises providing an input section for coupling radiation into the waveguide portion, and an output section for coupling radiation out of the waveguide portion and forming a first contact for electrically contacting the first electrode and forming a second contact for electrically contacting the second electrode of the vertical p-i-n diode. According to embodiments of the present disclosure, the waveguide portion is manufactured such that it comprises at least part of the intrinsic semiconductor region of the vertical p-i-n diode. The input section, the output section and the waveguide portion of the vertical p-i-n diode waveguide are configured for supporting a multimode interference pattern for the multimode wave with an optical field with a lateral inhomogeneous spatial distribution in the waveguide portion comprising regions with higher optical field intensity and regions with lower optical field intensity, the second contact physically contacting the second electrode in at least one region of the waveguide with lower optical field intensity. In embodiments, the intrinsic semiconductor region may be a region comprising an undoped semiconductor material (e.g. Ge).

In some embodiments, the step of providing the first electrode doped with charge carriers of the first charge may comprise providing a first semiconductor material (e.g. Si) and subsequently implanting the first semiconductor material with ions to generate charge carriers of the first charge (e.g. electrons). In some embodiments, a part of the first electrode may be more heavily doped to form a contact region.

In some embodiments, the step of providing the second electrode doped with charge carriers of the opposite charge may comprise implanting a part (e.g. a top portion) of the intrinsic semiconductor region with ions to generate charge carriers of the opposite charge (e.g. holes).

In some embodiments, the step of providing an input section may be performed before or after step providing a second electrode. In some embodiments, the step of providing an input section may be performed before or concurrently with the step of providing a first electrode, providing an intrinsic semiconductor region or the step of providing a second electrode. The input and output sections may, for example, comprise the first semiconductor material and be provided together with the first electrode, or they may be provided separately therefrom. As long as the input and output sections are present and functional in the final device, there is for the present disclosure no particular limitation on when they can be provided. In embodiments, the input and/or output sections may be doped or undoped.

In some embodiments, any feature of any embodiment of the second aspect may independently be as correspondingly described for any embodiment of the first aspect.

The disclosure will further be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

FIG. 6 to FIG. 15 illustrate different steps in an exemplary method for manufacturing a VPIN diode waveguide, each drawing illustrating a first cross-section in a first direction perpendicular to the longitudinal direction of the waveguide portion, as shown on the left hand side and a second cross-section in a second direction along the longitudinal direction of the waveguide portion. The perpendicular and longitudinal cross-sections are respectively according to the cross-section lines AA and BB as shown in FIG. 2.

Figure 6:
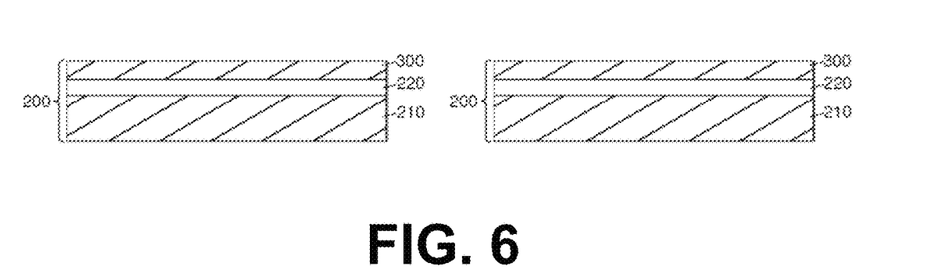
FIG. 6 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 6. A silicon-on-insulator (SOI) substrate 200 is provided comprising a Si wafer 210 covered by a $SiO_2$ insulator layer 220 and a Si layer 300 thereon.

Figure 7:
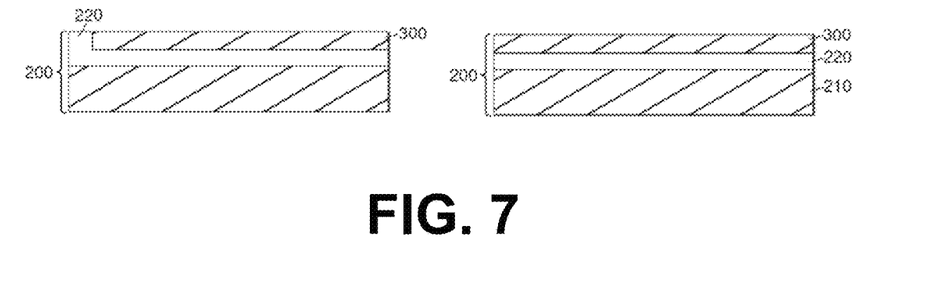
FIG. 7 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 7. A pattern is etched into the Si layer 300 and is filled with the insulator 220, e.g. $SiO_2$. The pattern may, for example, define a region of the substrate 200 in and/or over which the waveguide will be formed.

Figure 8:
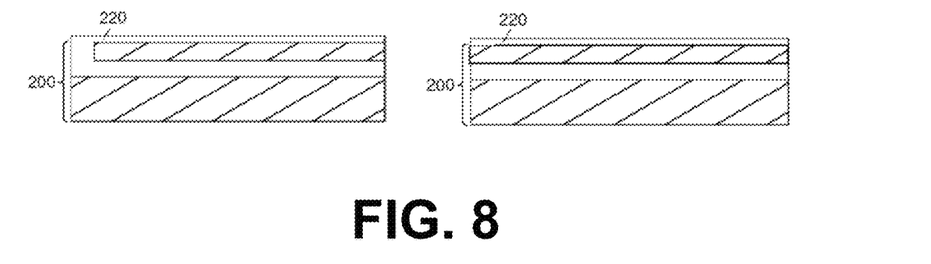
FIG. 8 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 8. The insulator layer 220 is grown by depositing an additional thin insulator layer, e.g. a 5 nm $SiO_2$ layer, covering the substrate 200.

Figure 9:
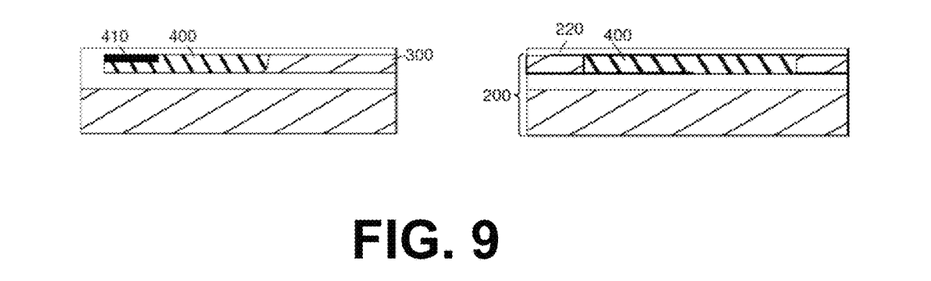
FIG. 9 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 9. A first electrode 400 is defined in the Si layer 300 by implanting ions to generate charge carriers of a first charge (e.g. electrons) in a pattern in the Si layer 300 (thereby obtaining e.g. an n-type doping). A part 410 of the first electrode 400 is more heavily doped with the first charge carriers (e.g. to obtain an n+-type doping), so as to form a contact region 410 for the first electrode 400.

Figure 10:
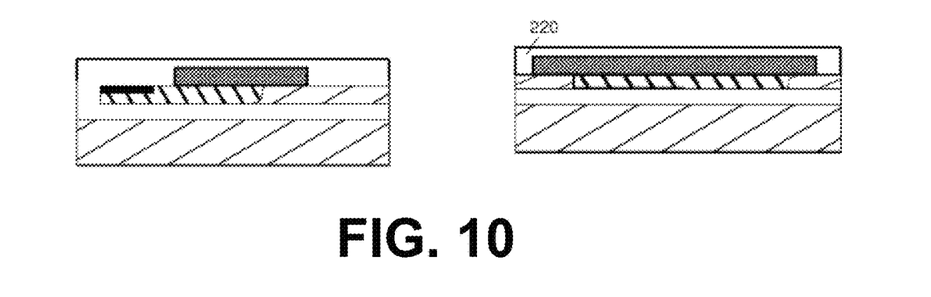
FIG. 10 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.
Figure 11:
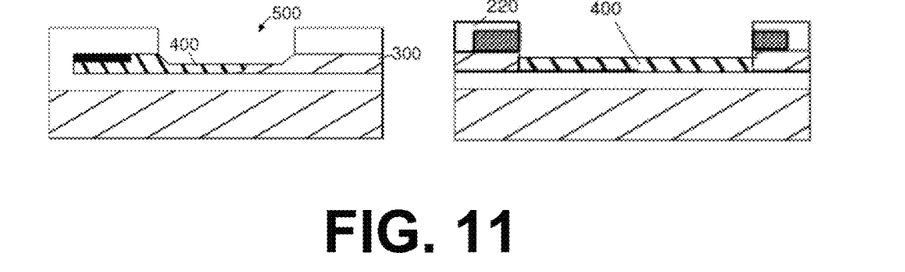
FIG. 11 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 10. A poly-silicon layer is deposited and subsequently patterned. Furthermore, an oxide deposition is performed as well as a planarization step. We now refer to FIG. 11. The first electrode 400 and Si layer 300 are partially recessed through an opening 500. The opening is made by etching part of the oxide layer, the polysilicon layer and the silicon layer.

Figure 12:
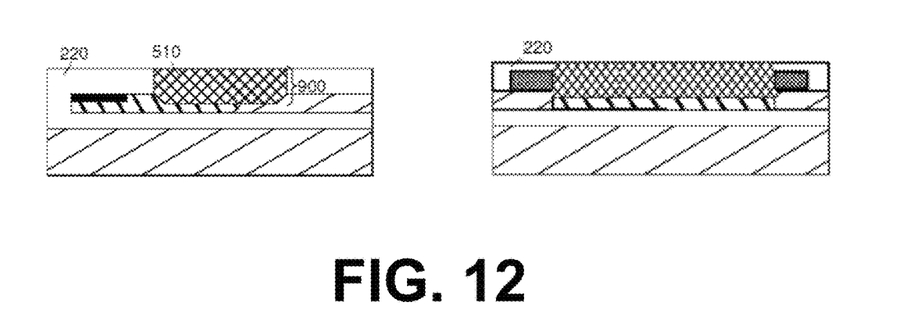
FIG. 12 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 12. An intrinsic semiconductor region 510 is formed by filling the opening 500 with a semiconductor (e.g. Ge). The intrinsic semiconductor region 510 may have a top surface which is coplanar with the insulator layer 220; for example by overfilling the opening 500 with the semiconductor and subsequently performing a chemical-mechanical polishing. The intrinsic semiconductor region typically doubles up as the waveguide portion 900 and is thus adapted for that purpose. In particular, the VPIN diode waveguide (e.g. especially the intrinsic semiconductor region 900 thereof) is typically configured for inducing a multimode interference pattern for the multimode wave to form an optical field with a lateral inhomogeneous spatial distribution in the waveguide portion 900. The lateral inhomogeneous spatial distribution typically comprises regions with higher optical field intensity and regions with lower optical field intensity. To achieve this lateral inhomogeneous spatial distribution, an input section and/or output section (not shown in FIG. 12) at the interface with the waveguide portion 900, for respectively coupling radiation into and out of the waveguide portion 900, may have a width smaller than the width of the waveguide portion. One way to implement the input-output waveguide for a Ge MMI waveguide is to use poly-silicon waveguides. Poly-silicon will not absorb the light whereas Ge will absorb for typical wavelengths of interest. Furthermore, the input section and/or the output section configured such that their centers are aligned with a local maximum intensity of the interference pattern of the at least two guided modes of the multimode waveguide portion 900.

Figure 13:
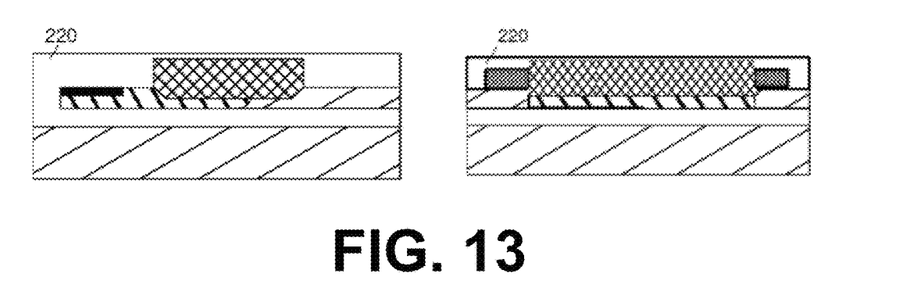
FIG. 13 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 13. The thickness of the insulator layer 220 is further increased by depositing thereon a further thin layer insulator.

Figure 14:
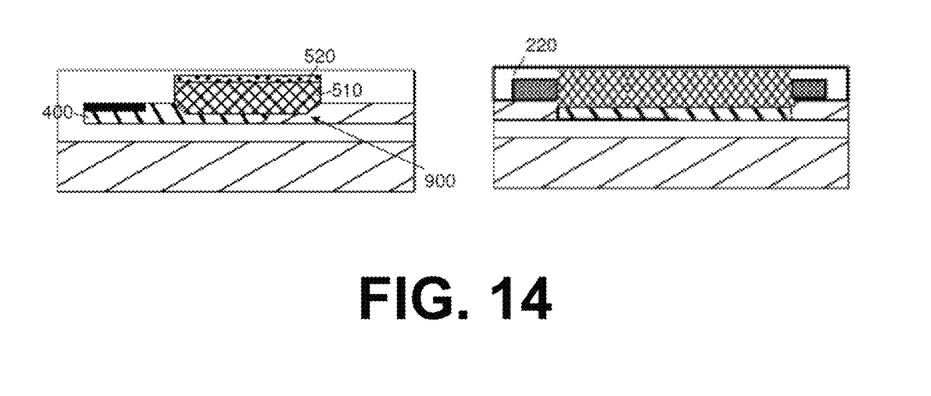
FIG. 14 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 14. A second electrode 520 is formed by implanting charge carriers of the opposite charge (e.g. holes) into a top part of the intrinsic semiconductor region 510 (thereby obtaining e.g. a p+-type doping). A vertical p-i-n diode waveguide 100 is thereby formed, comprising the first electrode 400, the intrinsic semiconductor region 510 and the second electrode 520.

Figure 15:
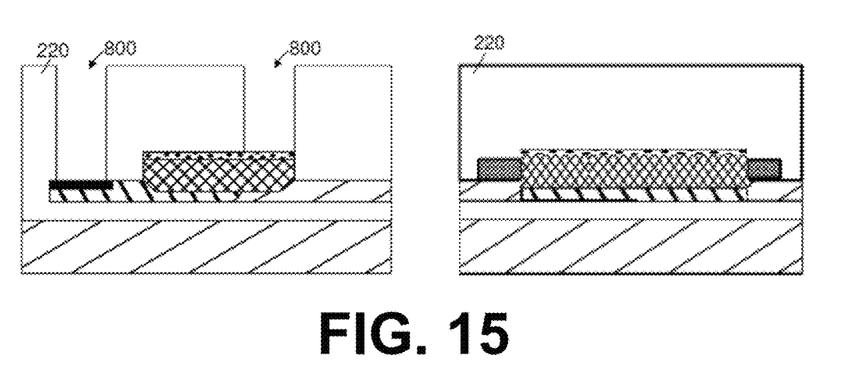
FIG. 15 illustrates schematic vertical cross-sections (perpendicular (left) and along (right) the longitudinal direction of the waveguide portion) of intermediate structures in the manufacture of an electro-optical device that includes a vertical p-i-n diode, according to example embodiments.

We now refer to FIG. 15. The insulator layer 220 is grown further and via holes 800 for accessing the first electrode 400 and the second electrode 520 are patterned and subsequently formed therein.

In a second example, optical simulation results are discussed for an example VPIN diode waveguide. The dimensions used for the example VPIN diode waveguide are shown (FIG. 16) and listed in the table below. It will be understood that the particular dimensions mentioned for the example are not limiting, and that other dimensions can be used for different designs. The particular dimensions for a given design could be optimized by optical design (e.g. using an optical simulator).

Figure 16:
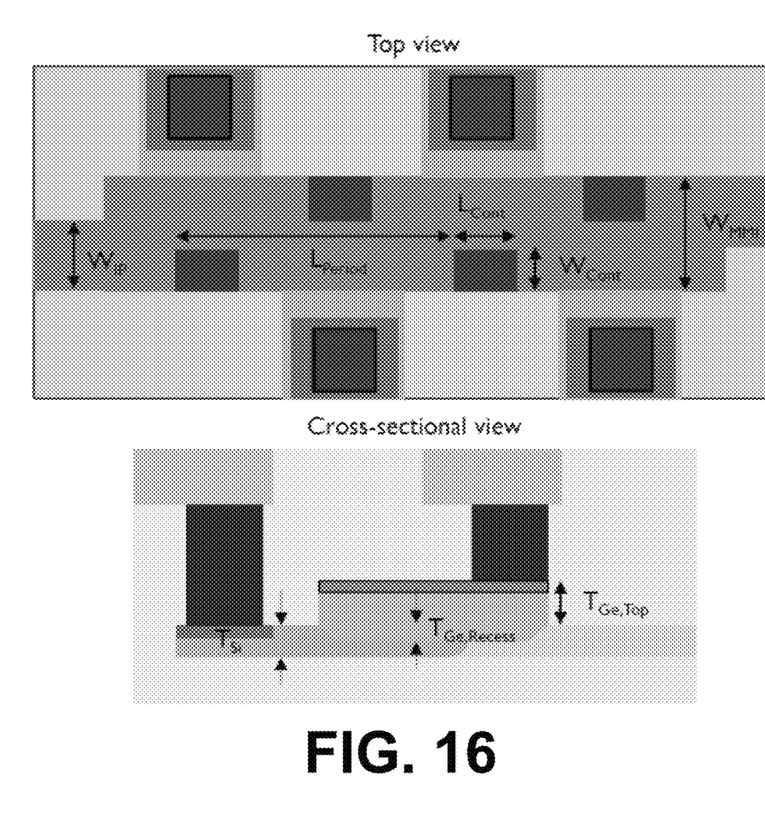
FIG. 16 is a schematic top view and vertical cross-section of a vertical p-i-n diode waveguide, according to example embodiments.

| Name | Property | Dimension |
|---|---|---|
| $W_{IP}$ | Input waveguide width | 0.5 μm |
| $L_{period}$ | Distance between contact | 4.5 μm |
| $L_{cont}$ | Contact length | 0.5 μm |
| $W_{cont}$ | Contact width | 0.25 μm |
| $W_{MMI}$ | MMI waveguide width | 0.8 μm |
| $T_{Ge,\,Top}$ | Top Ge waveguide thickness | 0.19-0.29 μm |
| $T_{Ge,\,Recess}$ | Recess Ge waveguide thickness | 0.11 μm |
| $T_{Si}$ | Si thickness | 0.22 μm |

Figure 17:
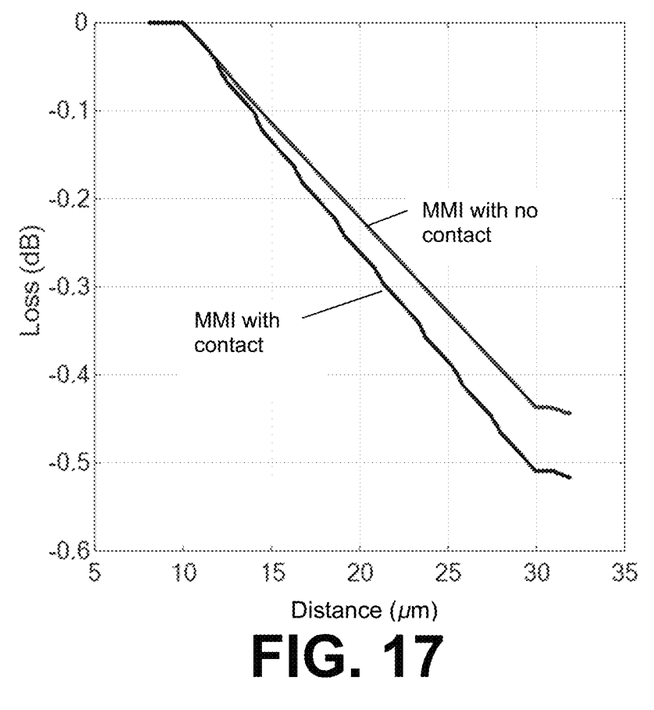
FIG. 17 is a graphical illustration of distance over loss for a multimode interference with contact and without contact, according to example embodiments.

For the example VPIN diode waveguide, optical simulation was performed for a wavelength of 1550 nm. The excess induced loss induced due to the vertical contact of the VPIN was simulated and is shown in FIG. 17. It can be seen that the loss reduces up to roughly one order of magnitude for a design with a multimode waveguide configuration according to an embodiment of the present disclosure.

Figure 18A:
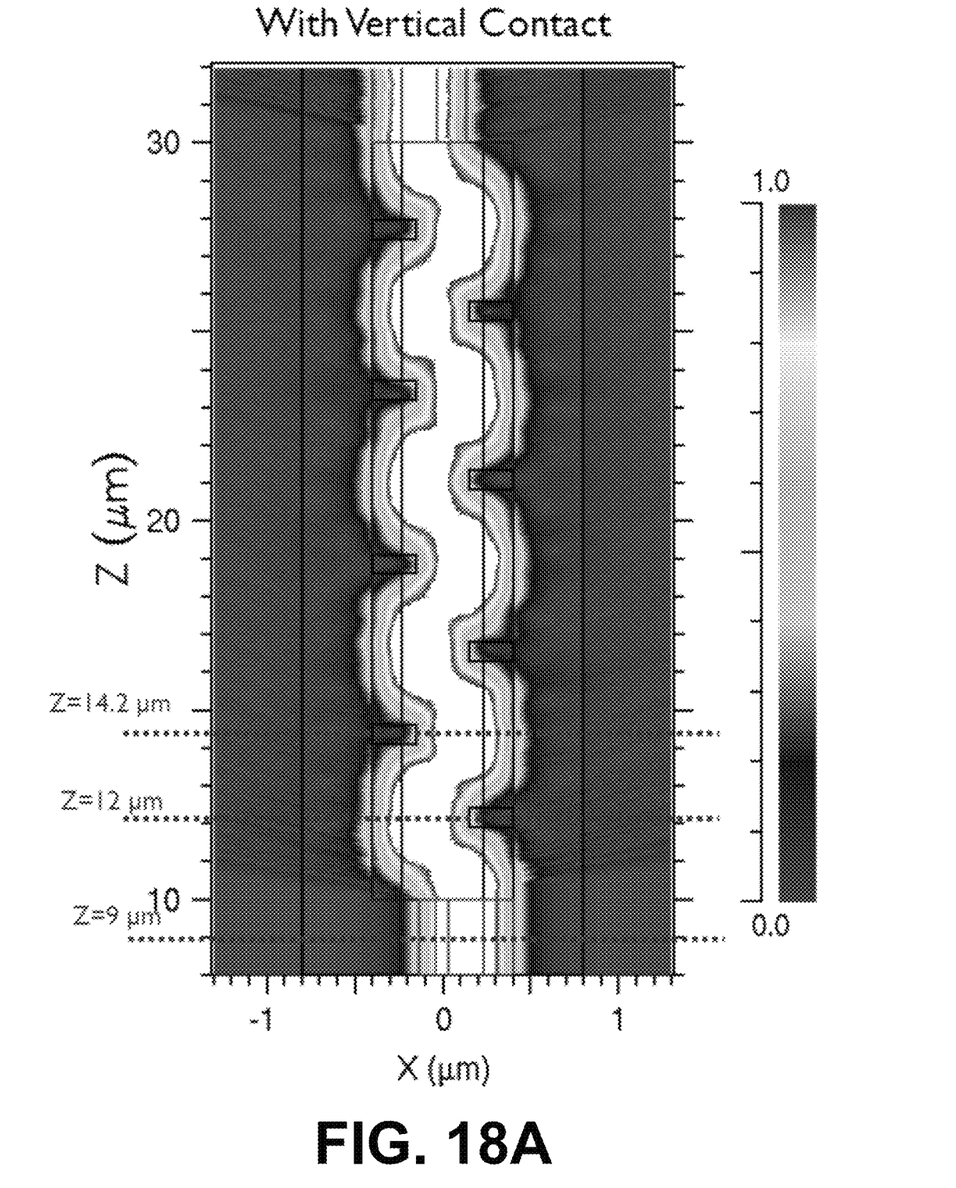
FIG. 18A shows simulation results of the optical field of a multi-mode interference pattern for a VPIN diode waveguide, according to example embodiments.
Figure 18B:
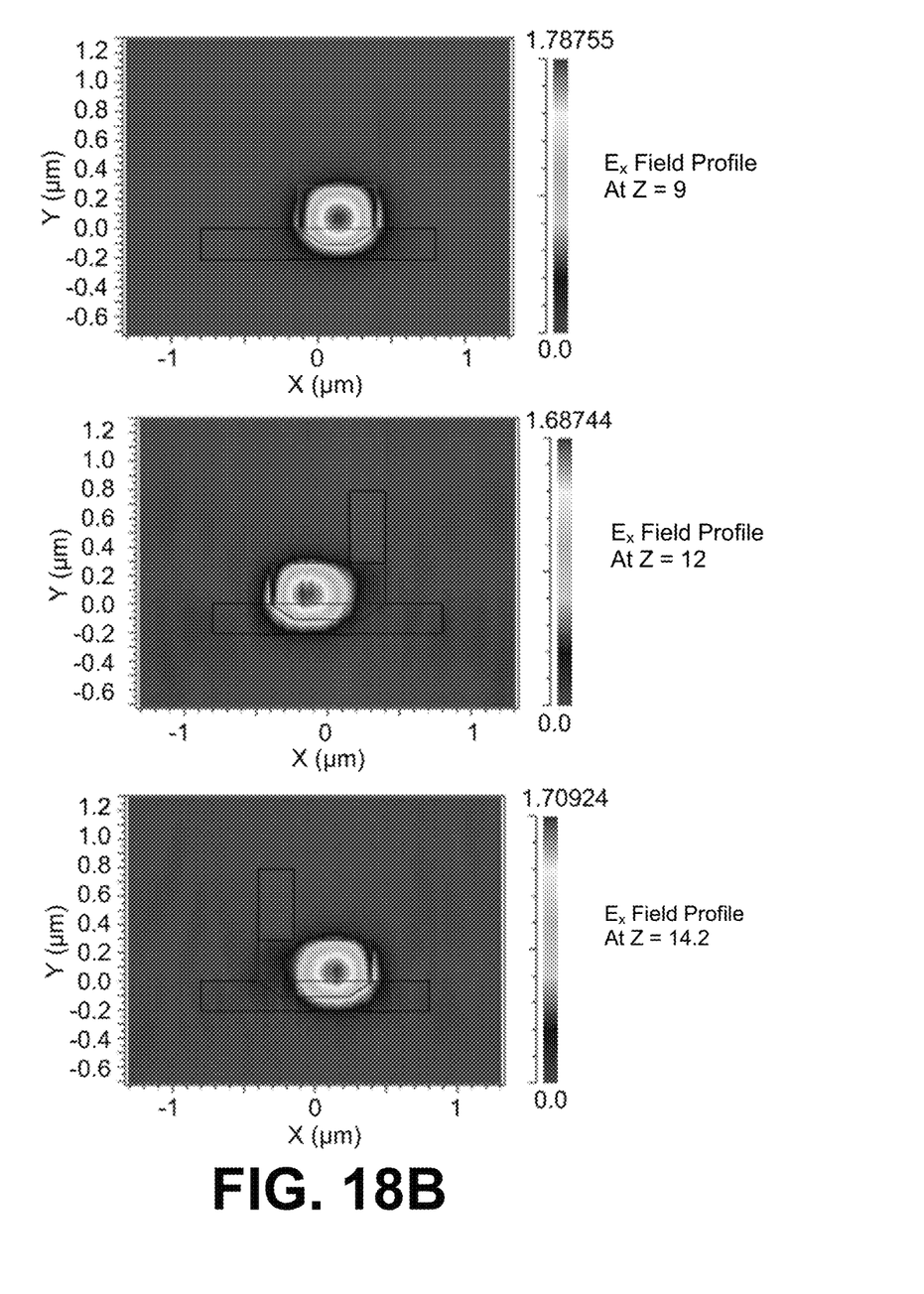
FIG. 18B shows simulation results of the optical field in cross-sectional profiles corresponding to the multi-mode interference, according to example embodiments.

FIG. 18A shows the optical field for the multi-mode interference occurring in a VPIN diode waveguide according to an embodiment of the present disclosure. It can be seen that a meander like optical path is present in the waveguide portion. In FIG. 18B the optical field distributions in the cross-sections at Z=9 μm, 12 μm and 14.2 μm are shown.

It is to be understood that although various embodiments, specific constructions and configurations, as well as materials, have been discussed herein for devices according to the present disclosure, changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. An integrated electro-optical semiconductor device comprising a vertical p-i-n diode waveguide, the device comprising:
   a waveguide portion adapted for propagating a multimode wave comprising an intrinsic semiconductor region for the vertical p-i-n diode;
   a first contact and a second contact for electrically contacting a first electrode and a second electrode of the vertical p-i-n diode;
   an input section for coupling radiation into the waveguide portion; and
   an output section for coupling radiation out of the waveguide portion,
   wherein the input section, the output section, and the waveguide portion are configured to support a multi-mode interference pattern for the multimode wave with an optical field with a lateral inhomogeneous spatial distribution in the waveguide portion comprising regions with higher optical field intensity and regions with lower optical field intensity, and
   wherein the second contact physically contacts the second electrode in at least one region of the waveguide with lower optical field intensity.

2. The integrated electro-optical semiconductor device according to claim 1, wherein at least one of the input section or the output section are configured with respect to an interface with the waveguide portion so as to excite at least two guided modes of the waveguide portion.

3. The integrated electro-optical semiconductor device according to claim 2, wherein, at an interface between (i) the waveguide portion and (ii) the input section or the output section, the center of the input section or the output section is substantially aligned with a local maximum intensity of the interference pattern of the at least two guided modes of the waveguide portion.

4. The integrated electro-optical semiconductor device according to claim 1, wherein the input section or the output section has, at an interface with the waveguide portion, a width that is smaller than the width of the waveguide portion.

5. The integrated electro-optical semiconductor device according to claim 1, wherein the device is adapted for inducing the interference pattern such that the higher optical field intensity follows a meandering path along a propagation direction in the waveguide portion.

6. The integrated electro-optical semiconductor device according to claim 1, wherein the device is configured for exciting in the waveguide portion an odd first-order mode and an even first-order mode.

7. The integrated electro-optical semiconductor device according to claim 1, wherein the first contact is formed at least partly below regions of higher optical field intensity along a propagation direction in the waveguide portion.

8. The integrated electro-optical semiconductor device according to claim 7, wherein the first electrode is a doped layer forming a p-layer or an n-layer of the vertical p-i-n diode, having a pattern following the regions of higher optical field intensity.

9. The integrated electro-optical semiconductor device according to claim 1, wherein the vertical p-i-n diode is implemented in one of a Ge-on-Si material system, a Si material system, a Ge material system, a GeSi material system, a GeSn material system, a SiGeSn material system, or a III-V based material system.

10. The integrated electro-optical semiconductor device according to claim 1, wherein the optical field with a lateral inhomogeneous spatial distribution is adapted so that at least 50% of a surface area of the waveguide portion has the lower optical field intensity and is useable as contact area for the second contact.

11. The integrated electro-optical semiconductor device according to claim 1, the vertical p-i-n diode waveguide being reverse biased.

12. The integrated electro-optical semiconductor device according to claim 1, the device being a Ge based photodetector.

13. The integrated electro-optical semiconductor device according to claim 1, wherein the device is a Franz-Keldysh effect electro-absorption modulator or wherein the device is a multi-quantum well based quantum-confined Stark effect based electro-absorption modulator.

14. A variable optical attenuator comprising a vertical p-i-n diode waveguide, the variable optical attenuator comprising:
- a waveguide portion adapted for propagating a multimode wave comprising an intrinsic semiconductor region for the vertical p-i-n diode;
- a first contact and a second contact for electrically contacting a first electrode and a second electrode of the vertical p-i-n diode;
- an input section for coupling radiation into the waveguide portion; and
- an output section for coupling radiation out of the waveguide portion,
- wherein the input section, the output section, and the waveguide portion are configured to support a multimode interference pattern for the multimode wave with an optical field with a lateral inhomogeneous spatial distribution in the waveguide portion comprising regions with higher optical field intensity and regions with lower optical field intensity, and
- wherein the second contact physically contacts the second electrode in at least one region of the waveguide with lower optical field intensity.

15. A method for manufacturing an integrated electro-optical semiconductor device comprising a vertical p-i-n diode waveguide, the device comprising a waveguide portion adapted for propagating a multimode wave, the waveguide portion comprising an intrinsic semiconductor region of the vertical p-i-n diode, the method comprising:
- providing a first electrode in a pattern on a substrate, the first electrode being doped with charge carriers of a first polarity;
- providing an intrinsic semiconductor region on the first electrode,
- providing a second electrode on the intrinsic semiconductor region, the second electrode being doped with charge carriers of an opposite polarity;
- providing an input section for coupling radiation into the waveguide portion and an output section for coupling radiation out of the waveguide portion;
- forming a first contact for electrically contacting the first electrode of the vertical p-i-n diode; and
- forming a second contact for electrically contacting the second electrode of the vertical p-i-n diode,
- wherein the waveguide portion comprises at least part of the intrinsic semiconductor region of the vertical p-i-n diode, and
- wherein the input section, the output section, and the waveguide portion of the vertical p-i-n diode are configured for supporting a multimode interference pattern for the multimode wave with an optical field with a lateral inhomogeneous spatial distribution in the waveguide portion comprising regions with higher optical field intensity and regions with lower optical field intensity, the second contact physically contacting the second electrode in at least one region of the waveguide with lower optical field intensity.

16. The method according to claim 15, wherein at least one of the input section or the output section are configured with respect to an interface with the waveguide portion so as to excite at least two guided modes of the waveguide portion.

17. The method according to claim 16, wherein, at an interface between (i) the waveguide portion and (ii) the input section or the output section, the center of the input section or the output section is substantially aligned with a local maximum intensity of the multimode interference pattern of the at least two guided modes of the waveguide portion.

18. The method according to claim 15, wherein the input section or the output section has, at an interface with the waveguide portion, a width that is smaller than the width of the waveguide portion.

19. The method according to claim 15, wherein the device is adapted for inducing the multimode interference pattern such that the higher optical field intensity follows a meandering path along a propagation direction in the waveguide portion.

20. The method according to claim 15, wherein the device is configured for exciting in the waveguide portion an odd first-order mode and an even first-order mode.

* * * * *